(12) United States Patent
Kim

(10) Patent No.: US 8,502,085 B2
(45) Date of Patent: Aug. 6, 2013

(54) MULTI-LAYER SUBSTRATE WITH A VIA HOLE AND ELECTRONIC DEVICE HAVING THE SAME

(75) Inventor: Young-seok Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 935 days.

(21) Appl. No.: 11/855,423

(22) Filed: Sep. 14, 2007

(65) Prior Publication Data

US 2008/0169564 A1 Jul. 17, 2008

(30) Foreign Application Priority Data

Jan. 11, 2007 (KR) .................. 10-2007-0003295

(51) Int. Cl.
*H05K 1/11* (2006.01)
(52) U.S. Cl.
USPC ........... 174/266; 174/262; 174/263; 174/264; 174/265; 361/792; 361/793; 361/794; 361/795
(58) Field of Classification Search
USPC ................ 174/262–266; 361/792–795
See application file for complete search history.

(56) References Cited

U.S. PATENT DOCUMENTS

| | | | | |
|---|---|---|---|---|
| 6,388,208 B1 * | 5/2002 | Kiani et al. | .................. | 174/266 |
| 6,392,164 B1 * | 5/2002 | Iwaki et al. | .................. | 174/262 |
| 6,479,764 B1 * | 11/2002 | Frana et al. | .................. | 174/262 |
| 6,933,450 B2 * | 8/2005 | Okumichi et al. | ............ | 174/264 |
| 6,937,120 B2 * | 8/2005 | Fisher et al. | ................. | 333/246 |
| 7,149,092 B2 * | 12/2006 | Iguchi | ........................... | 361/780 |
| 7,360,308 B2 * | 4/2008 | Oggioni et al. | ................. | 29/852 |
| 7,372,143 B2 | 5/2008 | Nakamura et al. | | |
| 2003/0080836 A1 | 5/2003 | Hagaishi et al. | | |
| 2004/0069529 A1 | 4/2004 | Oggioni et al. | | |
| 2004/0188826 A1 | 9/2004 | Palanduz et al. | | |
| 2004/0251047 A1 * | 12/2004 | Bartley et al. | ................. | 174/262 |
| 2005/0030231 A1 * | 2/2005 | Nagaishi et al. | ....... | 343/700 MS |

(Continued)

FOREIGN PATENT DOCUMENTS

| CN | 1655662 | 8/2005 |
|---|---|---|
| DE | 102004036890 | 2/2006 |

(Continued)

OTHER PUBLICATIONS

European Search Report issued Jul. 29, 2009 in EP Application No. 07123183.1.
Chinese Office Action issued Jan. 26, 2011 in CN Application No. 200810001765.1.

(Continued)

Primary Examiner — Hung S Bui
Assistant Examiner — James Wu
(74) Attorney, Agent, or Firm — Stanzione & Kim, LLP

(57) ABSTRACT

A multi-layer substrate includes a plurality of substrate main bodies, a plurality of layers which are alternately layered with the main bodies, a signal via hole which is connected with a signal line and includes a signal column which passes through at least one substrate main body; and a sub via hole which includes a sub column which surrounds the signal column, and a pair of sub pads which extend from end parts of the sub column to be formed to the layers, the layers which are formed with the sub pads being disposed in the same layer as the layers which are formed with the signal line of the signal via hole, or being disposed outside the layers which are formed with the signal line which is connected with the signal via hole.

32 Claims, 24 Drawing Sheets

U.S. PATENT DOCUMENTS

| | | | |
|---|---|---|---|
| 2005/0178585 A1 | 8/2005 | Kim et al. | |
| 2005/0247482 A1* | 11/2005 | Nakamura | 174/262 |
| 2006/0125573 A1* | 6/2006 | Brunette et al. | 333/33 |
| 2006/0158280 A1* | 7/2006 | Jow et al. | 333/33 |
| 2007/0194431 A1* | 8/2007 | Corisis et al. | 257/698 |

FOREIGN PATENT DOCUMENTS

| | | |
|---|---|---|
| DE | 102004036890 A1 * | 2/2006 |
| JP | 6-37416 | 2/1994 |
| JP | 1998-135640 | 5/1998 |
| JP | 2000-261150 | 9/2000 |
| JP | 2002-64256 | 2/2002 |
| JP | 2005-322807 | 11/2005 |

OTHER PUBLICATIONS

Chinese Office Action dated Sep. 23, 2011 issued in CN Application No. 200810001765.1.

European Office Action issued Jan. 26, 2012 in EP Application No. 07123183.1.

Extended European Search Report issued Apr. 17, 2012 in EP Application No. 12158708.3.

European Office Action issued May 3, 2011 in EP Application No. 07123183.1.

Korean Office Action dated Apr. 18, 2013 issued in KR Application No. 10-2007-0003295.

* cited by examiner

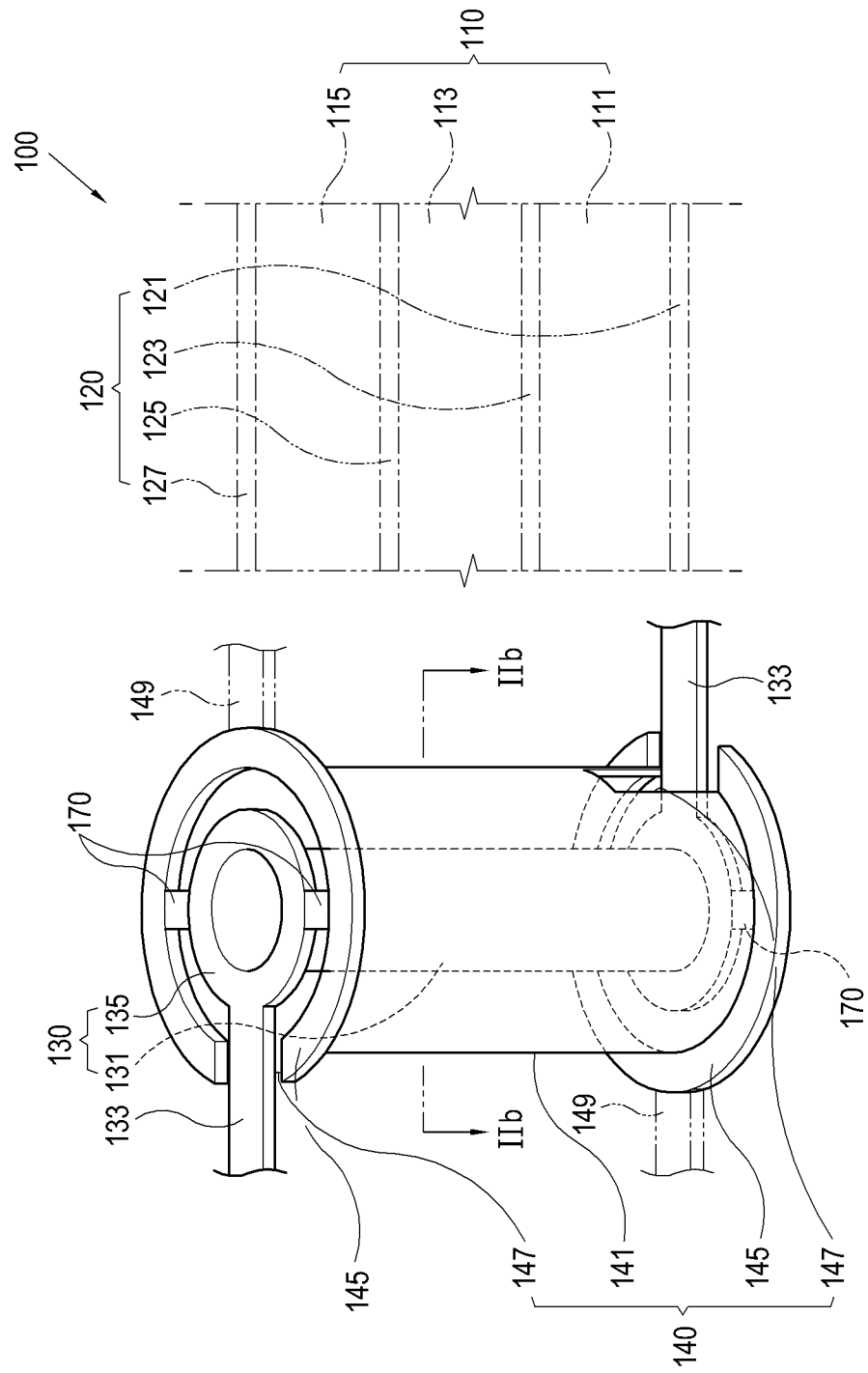

MULTI-LAYER SUBSTRATE WITH A VIA HOLE AND ELECTRONIC DEVICE HAVING THE SAME

CROSS-REFERENCE TO RELATED APPLICATIONS

This application claims priority from Korean Patent Application No. 10-2007-0003295, filed on Jan. 11, 2007 in the Korean Intellectual Property Office, the disclosure of which is incorporated herein by reference in its entirety.

BACKGROUND OF THE INVENTION

1. Field of the Invention

A multi-layer substrate and an electronic device having the same consistent with the present general inventive concept relate to improving a return current path of a signal line.

2. Description of the Related Art

In general, a substrate is widely used as a component of an electronic device from a home appliance such as a digital TV, a computer, etc. to a high technology communicating device. The substrate forms a signal line on a predetermined main body to couple electrical components such as an integrated circuit, a resistor, a switch, etc., or signal lines, thereby electrically connecting or transmitting a signal.

The substrate is classified into a single side substrate, a double side substrate, a multi-layer substrate, etc., according to the number of layers, and a component mounting capacity becomes superior as the number of layers increases. The single surface substrate is employed for a product such as a radio, etc., a circuit of which is not complicated, and the multi-layer substrate is employed for various electronic devices such, as a high performance computer, etc.

In general, in the multi-layer substrate, a substrate main body and a layer are layered in sequence, and a via hole is formed in the substrate main body to connect signal lines provided in other layers.

Here, when a data communication, a power supplying, a signal having a predetermined frequency, etc., are transmitted through the signal line, a return current is generated in an opposite direction to a signal transmission direction. It is preferable that the length, the path, etc., of the return current correspond with to the length, the path, etc., of the signal transmission path.

However, in the conventional multi-layer substrate, a signal distortion is generated due to discontinuity of the return current, and noise is generated at the multi-layer substrate which increases an electromagnetic in reference (EMI), etc. Also, EMI is radiated in a radial direction of a via hole to have an effect on other signals, thereby reducing a signal transmitting ability.

SUMMARY OF THE INVENTION

The present general inventive concept provides a multi-layer substrate and an electronic device having the same minimizing discontinuity of a return current path.

The present general inventive concept also provides a multi-layer substrate and an electronic device having the same which prevents an EMI radiation in a signal via hole, and improves a signal transmitting ability of a signal line.

Further, the present general inventive concept provides a multi-layer substrate and an electronic device having the same which stably supports a signal via hole.

Additional aspects and utilities of the present general inventive concept will be set forth in part in the description which follows and, in part, will be obvious from the description, or may be learned by practice of the present general inventive concept.

The foregoing and/or other aspects of the present general inventive concept can be achieved by providing a multi-layer substrate comprising a plurality of substrate main bodies; a plurality of layers which are alternately layered with the main bodies, a signal via hole which is connected with a signal line, and comprises a signal column which passes through at least one substrate main body, and a sub via hole which comprises a sub column which surrounds the signal column, and a pair of sub pads which extend from end parts of the sub column to be formed to the layers, the layers which are formed with the sub pads being disposed in the same layer as the layers which are formed with the signal line of the signal via hole, or being disposed outside the layers which are formed with the signal line which is connected with the signal via hole.

According to the general inventive concept, if the layers which are formed with at least one sub pad are the same layers as the layers which are formed with the signal line which is connected with at least one signal via hole, at least one sub pad and at least one signal line are formed in the same plane as the layers, and the sub via hole which is formed in the same plane as the signal line comprises a distance part which is distanced from the signal line.

According to the general inventive concept, if the layers which are formed with at least one sub pad are disposed outside the layers which are formed with the signal line which is connected with at least one signal via hole, the sub column is formed with a through part through which at least one signal line passes.

According to the general inventive concept, the substrate main bodies have a characteristic as a substrate dielectric, a sub dielectric is provided between the signal column and the sub column, and the sub dielectric comprises the same material as the substrate dielectric.

According to the general inventive concept, the substrate main bodies have the same property as a substrate dielectric, a sub dielectric is provided between the signal column and the sub column, and the sub dielectric comprises material different from the substrate dielectric.

According to the general inventive concept, the multi-layer substrate further comprises a supporter which connects the signal column and the sub column.

According to the general inventive concept, the sub pads are grounded.

The foregoing and/or other aspects of the present general inventive concept can be achieved by providing a multi-layer substrate comprising a plurality of substrate main bodies; a plurality of layers which are alternately layered with the main bodies, a signal via hole which is connected with a signal line, and comprises a signal column which passes through at least one substrate main body, a sub via hole which comprises a sub column which surrounds the signal column, and a pair of sub pads which extend from end parts of the sub column to be formed to the layers, and a supporter which connects the signal column and the sub column, the layers which are formed with the sub pads being disposed inside the layers which are formed with the signal line of the signal via hole.

According to the general inventive concept, the multi-layer substrate forms a substrate dielectric by means of property of the substrate main bodies, a sub dielectric is provided between the signal column and the sub column, and the sub dielectric comprises material different from the substrate dielectric.

The foregoing and/or other aspects of the present general inventive concept can be achieved by providing a multi-layer substrate comprising, a plurality of substrate main bodies; a plurality of layers which are alternately layered with the main bodies, a signal via hole which is connected with a signal line, and a signal column which passes through at least one substrate main body, and a sub via hole which comprises a sub column which surrounds the signal column, and a pair of sub pads which extend from end parts of the sub column to be formed to the layers, the layers which are formed with a first sub pad being disposed outside the layers which are formed with a first signal line which is connected with the signal via hole, and the layers which are formed with a second sub pad being disposed inside the layers which are formed with a second signal line which is connected with the signal via hole.

According to the general inventive concept, the sub column is formed with a through part through which one of the first or the second signal lines passes.

According to the general inventive concept, the substrate main bodies have a characteristic as a substrate dielectric, a sub dielectric is provided between the signal column and the sub column, and the sub dielectric comprises the same material as the substrate dielectric.

According to the general inventive concept, the substrate main bodies have a characteristic as a substrate dielectric, a sub dielectric is provided between the signal column and the sub column, and the sub dielectric comprises material different from the substrate dielectric.

According to the general inventive concept, the multi-layer substrate further comprises a supporter which connects the signal column and the sub column.

According to the general inventive concept, the sub pads are grounded.

The foregoing and/or other aspects of the present general inventive concept can be achieved by providing an electronic device, comprising a multi-layer substrate.

The foregoing and/or other aspects of the present general inventive concept can be achieved by providing a multi-layer substrate comprising a multi-layer substrate comprising a plurality of substrate main bodies; a plurality of layers which are alternately layered with the main bodies; a signal via hole connected with at least one signal line and including a signal column passing through at least one substrate main body, and a signal pad which is connected to the signal column; and a sub via hole including a sub column which is outside the signal column, and a sub pad which is connected to the sub column, the sub pad being disposed along a same plane as one of the plurality of layers which is formed with the signal line.

According to the general inventive concept, the signal pad can be disposed along a same plane as one of the plurality of layers which is formed with the signal line.

The sub via hole can comprise a plurality of sub pads and the signal via hole can comprise a plurality of signal pads, and the signal line can comprise a plurality of signal lines.

According to the general inventive concept, the plurality of sub pads can be disposed between the plurality of signal pads.

According to the general inventive concept, the plurality of sub pads and the plurality of signal pads can be disposed with the plurality of layers which can be formed with the plurality of signal lines.

According to the general inventive concept, one of the plurality of sub pads can be disposed between the plurality of signal pads and another one of the plurality of sub pads can be disposed with one of the plurality of layers which is formed with the signal line and one of the plurality of signal pads.

According to the general inventive concept, a supporter couples the signal pad and the sub pad.

According to the general inventive concept, a supporter which couples the signal column and the sub column.

According to the general inventive concept, the sub column is formed with a through part through which at least one signal line passes.

According to the general inventive concept, a signal transmission current path traveling within a plurality of signal lines and the signal via hole and sub via hole is substantially the same as a return current path.

BRIEF DESCRIPTION OF THE DRAWINGS

The above and/or other aspects and utilities of the present general inventive concept will become apparent and more readily appreciated from the following description of the exemplary embodiments, taken in conjunction with the accompanying drawings, in which:

FIGS. 2A and 2B are sectional views illustrating a multi-layer substrate according to a an exemplary embodiment of the present general inventive concept;

DETAILED DESCRIPTION OF THE PREFERRED EMBODIMENTS

Figure 1A:
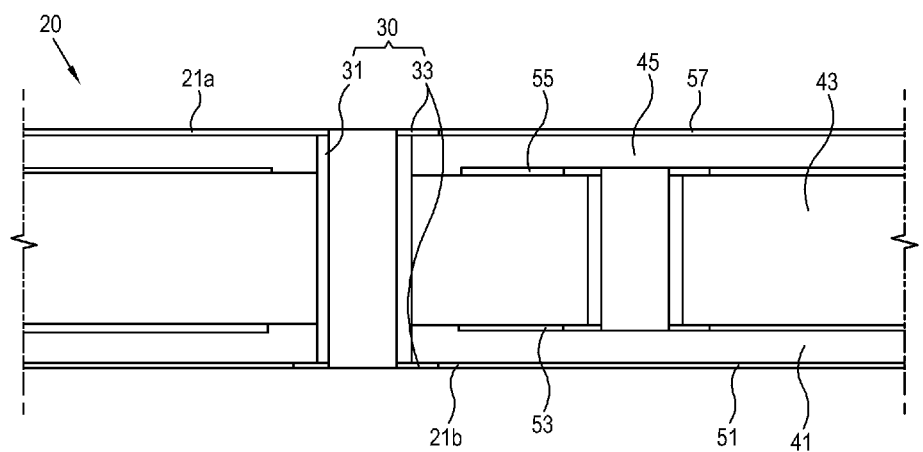
FIGS. 1A and 1B are sectional views illustrating a multi-layer substrate and a signal transmission path according to related art for comparison with an exemplary embodiment of the present general inventive concept.

Reference will now be made in detail to the embodiments of the present general inventive concept, examples of which are illustrated in the accompanying drawings, wherein reference numerals refer to their respective elements throughout. The embodiments are described below so as to explain the present general inventive concept by referring to the figures.

As illustrated in FIGS. 2A to 7B, a multi-layer substrate 100 according to a few examples of an exemplary embodiment of the present general inventive concept includes a signal via hole 130 and a sub via hole 140. The multi-layer substrate 100 includes a plurality of substrate main bodies 110 and layers 120 layered in sequence. The multi-layer substrate 100 may include a surface mounted device (SMD) mounted on a surface of the layers 120 to perform various functions. The multi-layer substrate 100 may include a plurality of layers, such as six layers, eight layers, etc, as well as four layers according to examples of the present embodiment.

The substrate main bodies 110 are formed of an electrical nonconductor to be interposed between the layers 120. Here, the substrate main bodies 110 include a first substrate main body 111, a second substrate main body 113 and a third substrate main body 115. The substrate main bodies 110 are layered with four layers 121, 123, 125 and 127 to support the multi-layer substrate 100. The substrate main bodies 110 include material such as an epoxy resin of an electrical non-conductor, and may selectively employ various known materials. The substrate main bodies 110 include the signal via hole 130 for an electrical connection, and the sub via hole 140 surrounding the signal via hole 130.

If a signal is transmitted to a signal line 133, etc., a polarization is generated in the substrate main bodies 110 positioned between the signal line 133 to function as a dielectric substrate having a predetermined dielectric constant.

The layers 120 are interposed between layers of the substrate main body 110, or may form external layers of the multi-layer substrate 100. The layer 120 may be formed with the signal line 133 or a grounding layer. The layers 120 include a first layer 121 formed at a lower part of the first substrate main body 111 as a lowermost layer, a second layer 123 provided between the first substrate main body 111 and the second substrate main body 113, a third layer 125 provided between the second substrate main body 113 and the third substrate main body 115, and a fourth layer 127 formed to an upper part of the third substrate main body 115 as an uppermost layer.

The layers 120 include an electrical conductor such as a copper sheet, etc. The layers 120 are formed with various type patterns to be electrically connected. In addition to the signal line 133, the layers 120 may be formed with various patterns employed to supply power, grounding the signal line 133, etc., or to transmit a high frequency signal. The layers 120 are formed with a signal pad 135 and a sub pad 145.

Also, the multi-layer substrate 100 may pass through a light exposing process emitting an ultraviolet ray, etc., a developing process to peel a part that does not receive the ultraviolet ray, etc., an etching process removing a part being not formed with a predetermined pattern, a cleaning process cleaning a substrate, and other processes so that the layers 120 can be layered with the substrate main bodies 110 to form a predetermined pattern of a copper thin film, etc.

The signal via hole 130 is connected with the signal line 133, and is formed through at least one substrate main body 110. The signal via hole 130 is electrically connected with the signal line 133 of other layers 120. The signal via hole 130 includes a signal column 131 and the signal pad 135.

The signal column 131 is formed in a cylindrical shape penetrating the substrate main body 110 and having a predetermined thickness. The signal column 131 includes material formed of an electrical conductor. The signal pad 135 from an end part of the signal column 131 is extended to the signal line 133 formed on the layer 120 to be electrically connected.

The signal line 133 is electrically connected with the signal via hole 130, and is provided to the layer 120. The signal line 133 may be electrically connected to one of the signal column 131 and the signal pad 135 of the signal via hole 130. The signal line 133 may perform various functions such as supplying power, transmitting a predetermined information, transmitting a signal having a predetermined frequency, or the like.

The signal pad 135 extends from an end part of the signal column 131 to be provided to the layer 120. The signal pad 135 includes an electrical conductor, and can include the same material as the signal column 131.

The sub via hole 140 is formed through the substrate main body 110, and is disposed to an outside of the signal via hole 130 to surround the signal via hole 130. The sub via hole 140 includes a sub column 141 and a sub pad 145. The sub via hole 140 is electrically connected with a grounding line 149 to be grounded. The sub via hole 140 includes a distance part 147, as illustrated in FIG. 2A. The sub via hole 140 may further include a through part 143 (see, for example, FIG. 5A. The sub via hole 140 may further include a middle pad 151 (see, for example, FIG. 6A).

The sub column 141 is formed in a cylindrical shape passing through the substrate main body 110 and having a predetermined thickness. The sub column 141 includes material formed of an electrical conductor. The sub column 141 extends from an end part with the sub pad 145 formed on the layer 120 to be electrically connected. The sub column 141 may be formed coaxially with the signal column 131 as illustrated, for example, in FIGS. 2A and 2B.

The sub column 141 is not electrically connected with the layer 120, which is not formed with the sub pad 145. However, the sub column 141 may be electrically connected with the layer 120 in case of a necessity such as grounding, etc.

The sub pad 145 extends from an end part of the sub column 141 to be provided to the layer 120. The sub pad 145 includes an electrical conductor, and includes the same material as the sub column 141.

Accordingly, the sub via hole 140 surrounding the signal via hole 130 is provided to minimize a return current path, thereby minimizing discontinuity of the return current path. Also, an electromagnetic interference (EMI), noise, etc., can be prevented from radiating from the signal via hole 130. Also, a signal distortion, a noise generation, etc., due to a difference between a signal transmission path and the return current path can be reduced.

The distance part 147 is formed at the sub via hole 140, and forms a distance between the sub via hole 140 and the signal line 133 so that the signal line 133 can pass therethrough. A distance between the signal line 133 and the sub via hole 140 may be variable according to the function of the signal line 133, a signal frequency, etc.

Accordingly, the return current path can be formed at the layer 120 closest to the signal line 133 along the distance part 147 to correspond to a signal transmission path of the signal line 133.

The grounding line 149 is electrically connected with the sub via hole 140 to ground a return current. Alternatively, the grounding line 149 may be formed at the third layer 125, that is, a lower end part of the distance part 147, to be electrically connected with the sub column 141.

The grounding line 149 may be formed at the layer 120 which is formed closest to the signal line 133 in order to be adjacent to a reflecting area range of the signal line 133. Here, the grounding line 149 may be formed to surround the signal line 133 as necessary.

A sub dielectric 160 (see FIGS. 2B, 3D-3F, 4, 5B, 6B-6E and 7B) is filled between the signal via hole 130 and the sub via hole 140. The sub dielectric 160 may include a material having a dielectric constant the same as or different from that of the substrate dielectric. Also, the sub dielectric 160 may include various materials different from that of the substrate dielectric to consider characteristic impedance or self impedance of the signal line 133. Also, the interval between the signal via hole 130 and the sub via hole 140 filled with the sub dielectric 160 may be determined to consider the characteristic impedance of the signal line 133.

A supporter 170 is coupled to the signal via hole 130 and the sub via hole 140 to support the signal via hole 130 with respect to the sub via hole 140. The supporter 170 is illustrated in FIG. 2A to have a rod shape, but may have other various shapes. The supporter 170 is formed of a non-conductive material.

A supporting position and the number of the supporters 170 may variously be provided to consider the material of the sub dielectric 160, the size of the signal via hole 130, the size of the sub via hole 140, etc.

Accordingly, the signal via hole 130 can be stably supported by the supporter 170.

Here, the sub pad 145 according to an exemplary embodiment is disposed in the layer 120 formed with the signal line 133 of the signal via hole 130, or disposed in the outside layer 120 from the layer 120 formed with the signal line 133 connected with signal via hole 130.

According to this configuration, representative examples of this exemplary embodiment will be explained sequentially referring to FIG. 2A through FIG. 7B.

Figure 2B:
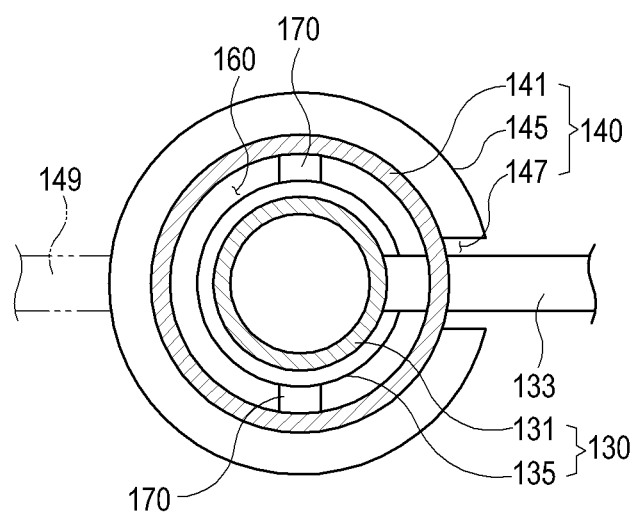

First, as illustrated in FIG. 2A and FIG. 2B, the sub pad 145 and the signal line 133 of the signal via hole 130 are disposed on the same layer 120. That is, the sub pad 145 and the signal line 133 are disposed together on the first layer 121 and the fourth layer 127 respectively. The distance part 147 is formed at the signal pad 135 on the first layer 121 and the fourth layer 127 for the signal line 133 to pass through. And, the sub pad 145 is connected with the grounding line 149 formed with the first layer 121 and the fourth layer 127. The supporter 170 is provided at the first layer 121 and the fourth layer 127 to support the signal via hole 130 with respect to the sub via hole 140.

Hereinafter, a manufacturing process of the multi-layer substrate 100 as illustrated in FIGS. 2A and 2B will be described while referring to FIGS. 3A to 3F.

Figure 3A:
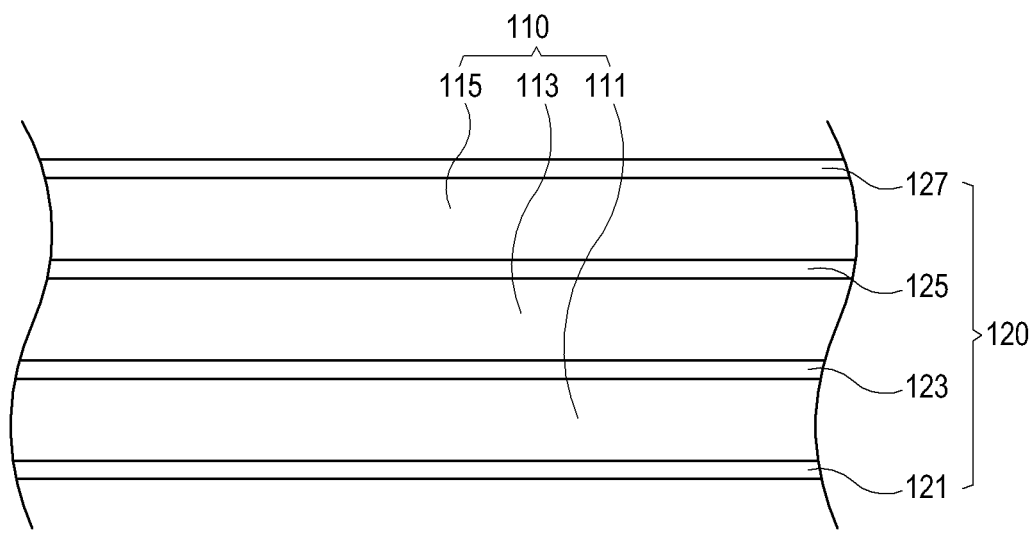
FIGS. 3A to 3F are sectional views illustrating a manufacturing process of the multi-layer substrate in FIG. 2A.

As illustrated in FIG. 3A, the first layer 121 is disposed in a lowermost layer, and the first substrate main body 111, the second layer 123, the second substrate main body 113, the third layer 125, the third substrate main body 115 and the fourth layer 127 are disposed thereon in sequence to manufacture the multi-layer substrate 100.

Figure 3B:
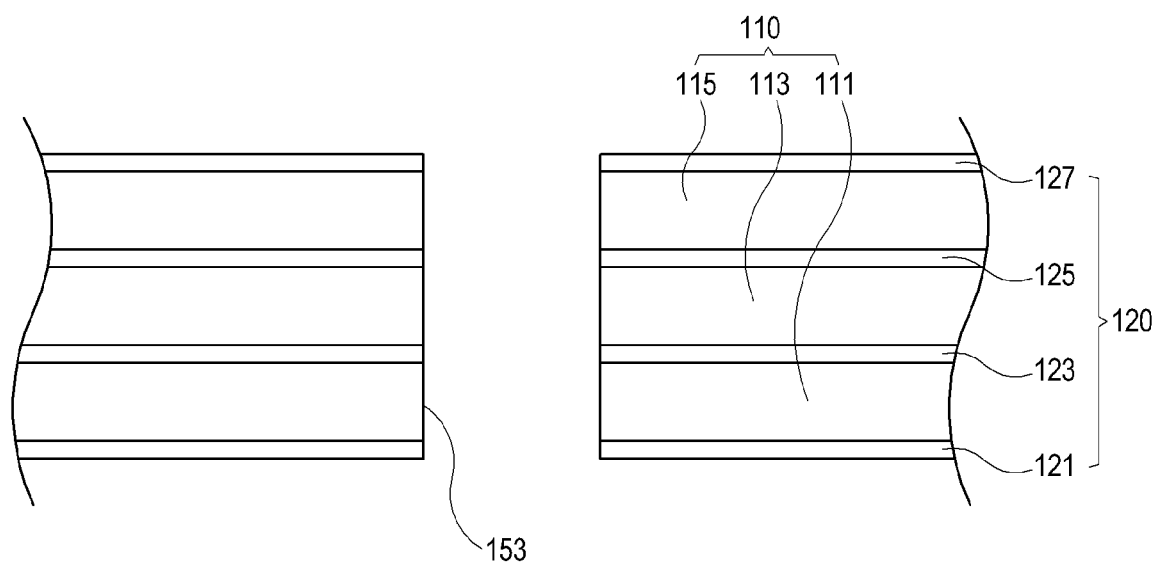

Then, as illustrated in FIG. 3B, a sub through hole 153 is formed to penetrate the multi-layer substrate 100.

Figure 3C:
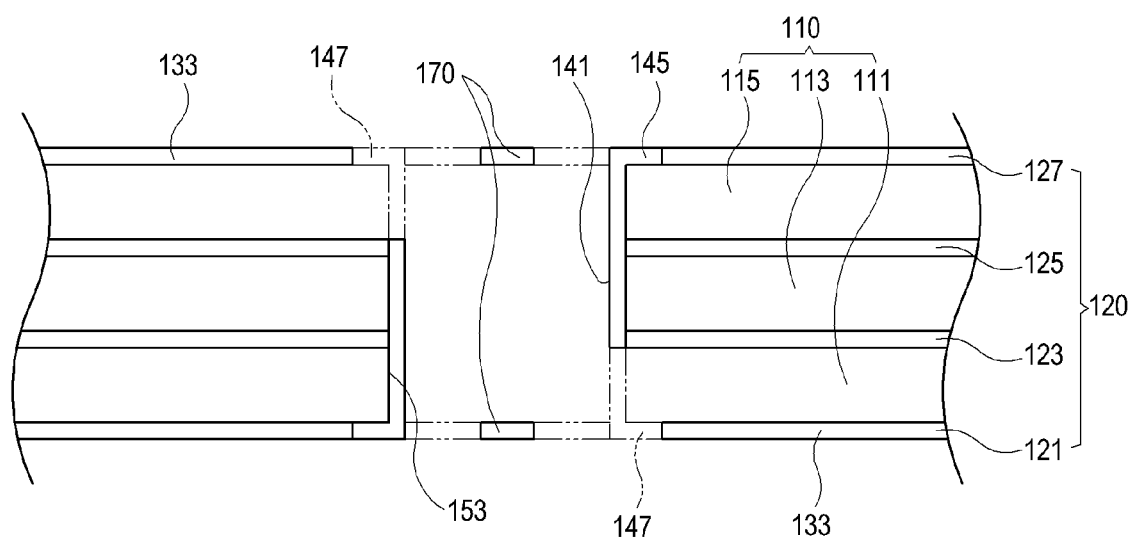

As illustrated in FIG. 3C, the sub column 141 is formed in the sub through hole 153, and the sub pad 145 is formed on the first layer 121 and the fourth layer 127. Here, the distance part 147 is formed so that the signal line 133 can pass through the sub via hole 140. The distance part 147 can prevent the sub column 141 and the sub pad 145 from being formed at the sub main body 110 in a forming process of the sub via hole 140. For example, various methods such as a method of attaching a tape to a part to which the distance part 147 is to be formed may be selectively employed.

The sub column 141 may be electrically connected with the second layer 123 or the third layer 125 in case of a necessity such as grounding, and not connected with the first layer 121 and the fourth layer 127, etc.

The supporter 170 is formed to the first layer 121 and the fourth layer 127, and is traversed through an inner space of the sub via hole 140 to be coupled with the sub pad 145. The supporter 170 may be formed as a nonconductor having a predetermined strength.

Figure 3D:
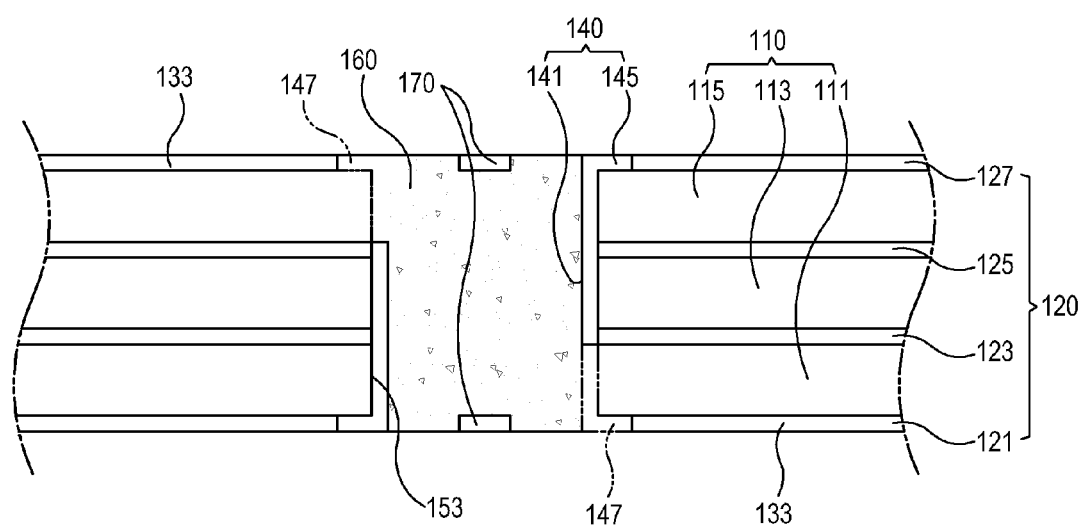
Figure 3E:
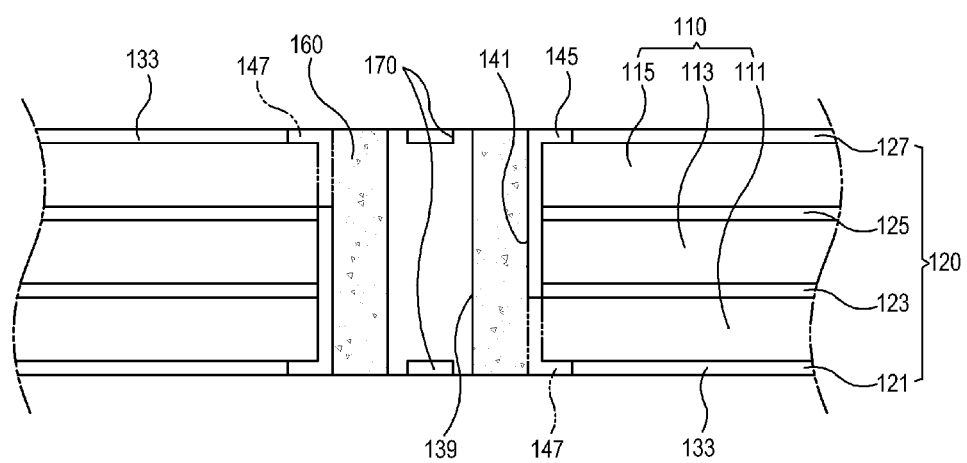

As illustrated in FIG. 3D, the sub dielectric 160 is filled inside the inner space of the sub via hole 140. In FIG. 3E, the signal through hole 139 is formed to pass through the sub dielectric 160 filled inside the sub via hole 140.

Figure 3F:
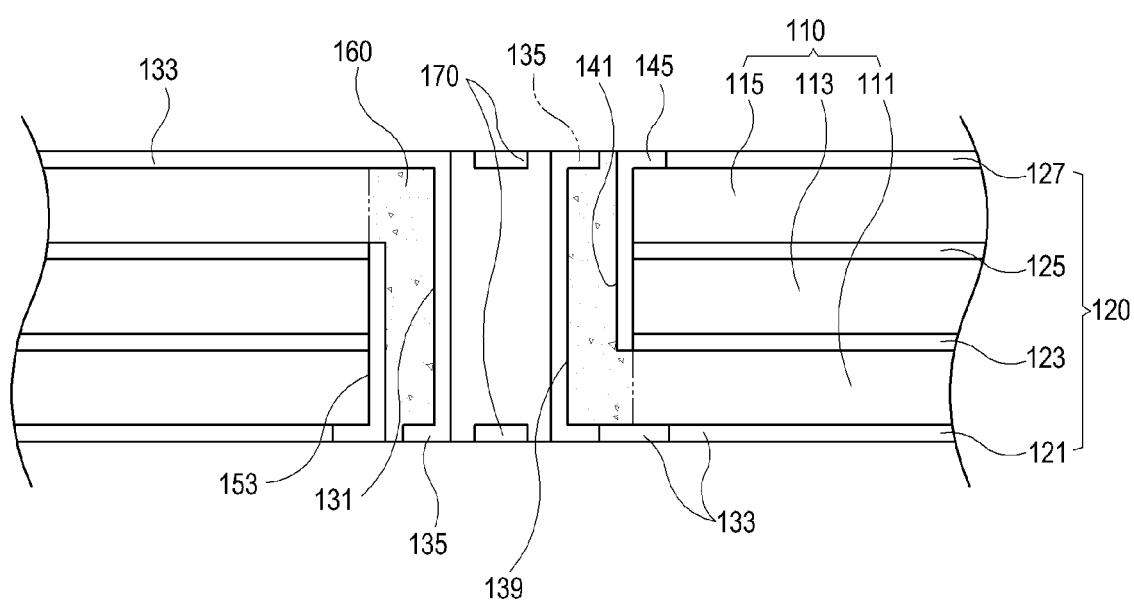

As illustrated in FIG. 3F, the signal column 131 is formed at the signal through hole 139, and the signal pad 135 is formed at the first layer 121 and the fourth layer 127 to electrically connect to the signal line 133. Here, the signal pad 135 may be coupled with the supporter 170 in the first layer 121 and the fourth layer 127 to be supported by the supporter 170.

A signal transmitting process of the multi-layer substrate 100 according to an exemplary embodiment of the present general inventive concept will be described while referring to FIG. 4.

Figure 1B:
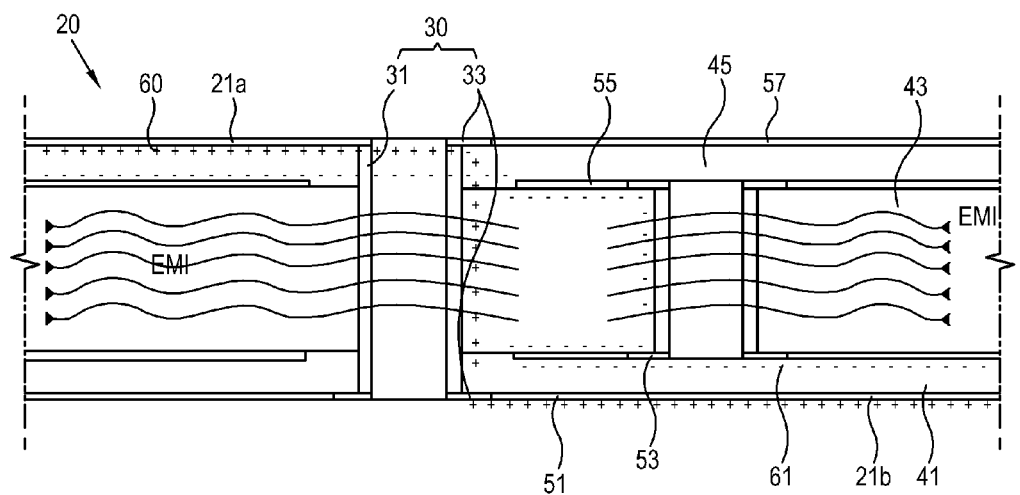

First, a comparative example illustrated in FIGS. 1A and 1B that does not provide a sub via hole 140 will be described to compare with the exemplary embodiment of FIG. 2A by referring to FIGS. 1A and 1B. As illustrated in FIGS. 1A and 1B, a multi-layer substrate 20 includes a four layer substrate 20 in which three substrate main bodies 41, 43 and 45 and four layers 51, 53, 55 and 57 are layered in sequence. Here, a via hole 30 is formed to pass through the substrate main bodies 41, 43 and 45 to electrically connect a signal line 21b formed in a first layer 51 and a signal line 21a formed in a fourth layer 57. Here, the via hole 30 includes a signal column 31 pass through the substrate main bodies 41, 43 and 45, and a signal pad 33 electrically connecting the signal lines 21a and 21b and the signal column 31.

In the conventional technology with this configuration of FIGS. 1A and 1B, a signal is transmitted to the signal lines 21a and 21b to transmit data, power or current supply, a signal with a predetermined frequency, etc. Here, when the signal is transmitted through a signal line or a plane, a return current flows through a signal line, plane or via hole closest to the signal line or the plane where the signal is being transmitted. Accordingly, as illustrated in FIG. 1B, a signal transmission current path 60 referring to '+' and the return current path 61 referring to '−' have irregular distances, or different lengths.

Figure 4:
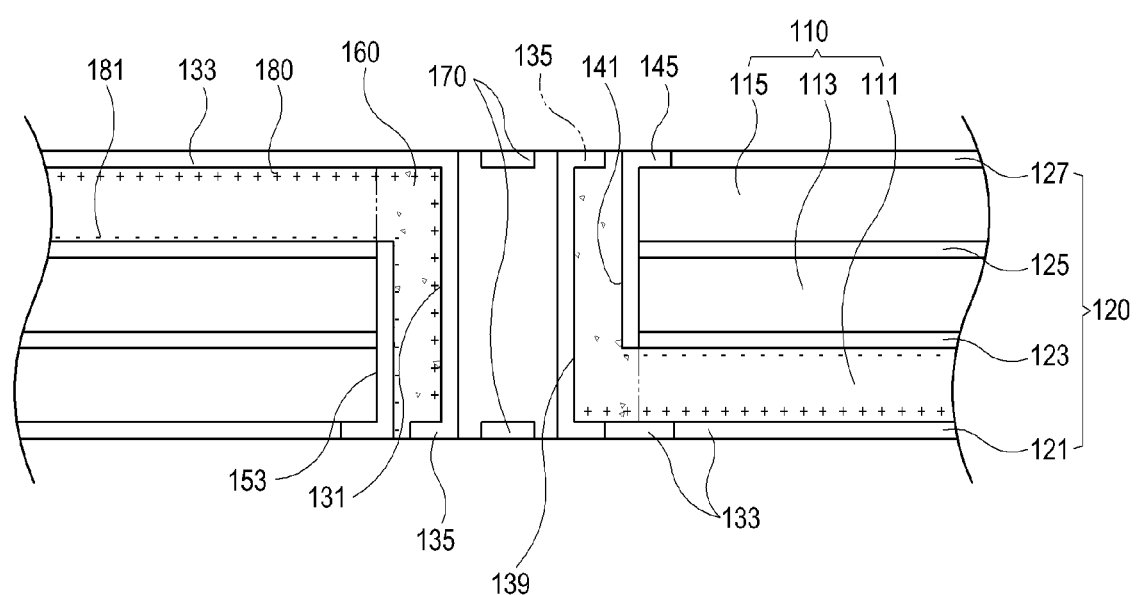
FIG. 4 is a sectional view illustrating a signal transmission path of the multi-layer substrate in FIG. 2A.

In contrast, as illustrated in FIG. 4, if a predetermined signal is transmitted in the signal line 133, there is almost no difference between a path through which a signal is transmitted. For example, the signal transmission generating a current path 180 referred to as '+', and a return current path 181 generated by a signal transmission referred to as '−' as illustrated in FIG. 4 illustrate no difference between the paths. In comparison with the multi-layer substrate 20 illustrated in FIG. 1B, the signal transmission path and the return current path of the multi-layer substrate 100 according to the present general inventive concept are almost in accordance with each other. Thus, the distance a current travels in a transmitted current path 180, including the signal line and signal via hole and sub via hole, is substantially the same as the distance a current travels in a return current path 181.

Accordingly, discontinuity of the return current path can be minimized. Also, EMI radiation in the signal via hole 130 can be prevented, and a signal transmitting ability of the signal line 133 can be improved. The signal via hole 130 can be stably supported.

As illustrated in FIGS. 5A to 6E, in the multi-layer substrate 100 according to an exemplary embodiment of the present general inventive concept, a first sub pad 145 is disposed in the layer 120 formed with a first signal line 133, and a second sub pad 145 is disposed in the outside the layer 120 from the layer 120 formed with a second signal line 133. A manufacturing process and signal transmission process of the multi-layer substrate 100 of FIGS. 5A and 5B may be provided as described below.

Figure 5A:
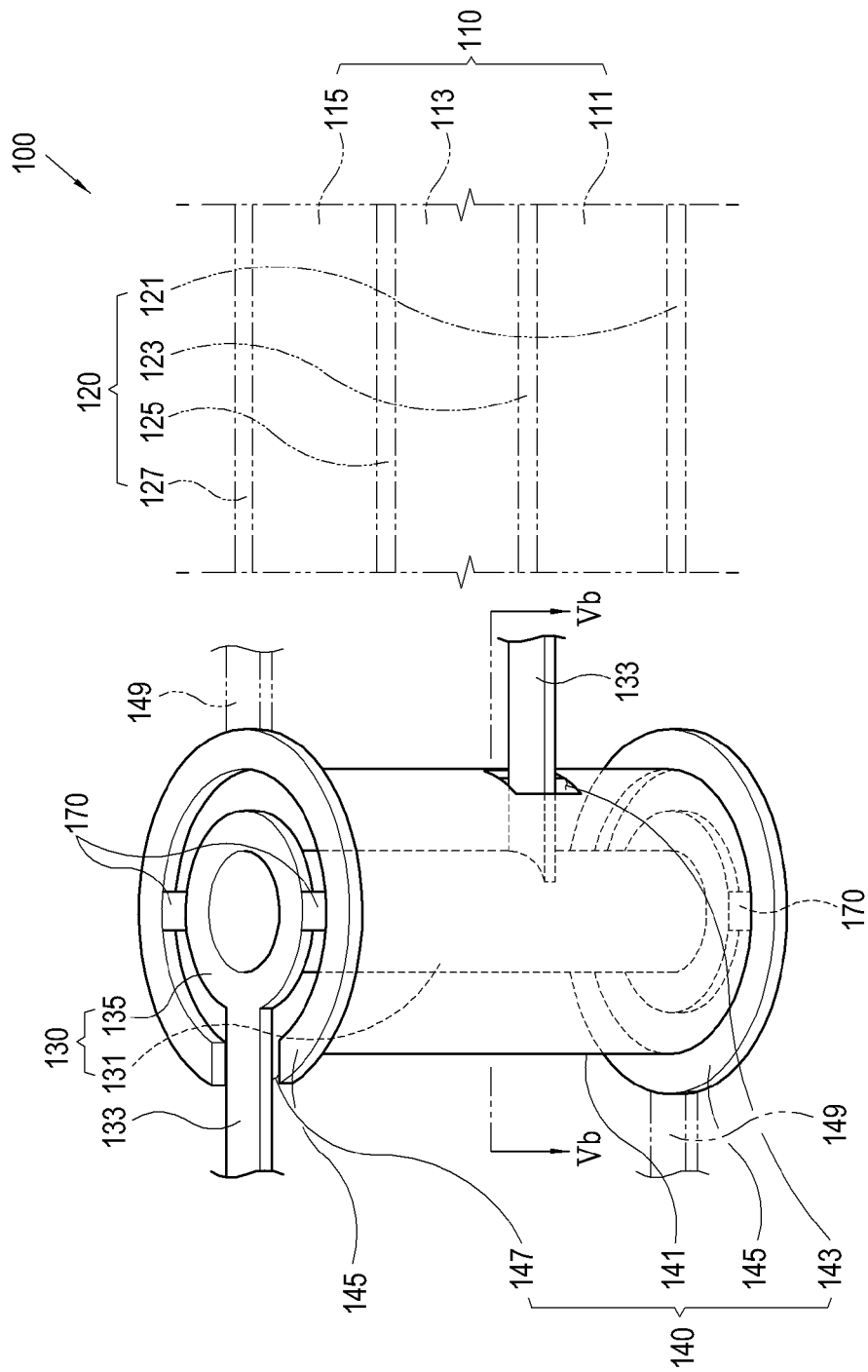
FIGS. 5A and 5B are sectional views illustrating a multi-layer substrate according to an example of the exemplary embodiment of FIGS. 1A and 1B.

In FIG. 5A, the sub pad 145 is formed in the first layer 121, and the signal line 133 is formed in the second layer 123. The sub pad 145 and the signal line 133 are formed in the fourth layer 127. Also, the supporter 170 is formed in the first layer 121 and the fourth layer 127. The distance part 147 and the through part 143 are formed at the sub via hole 140.

Figure 5B:
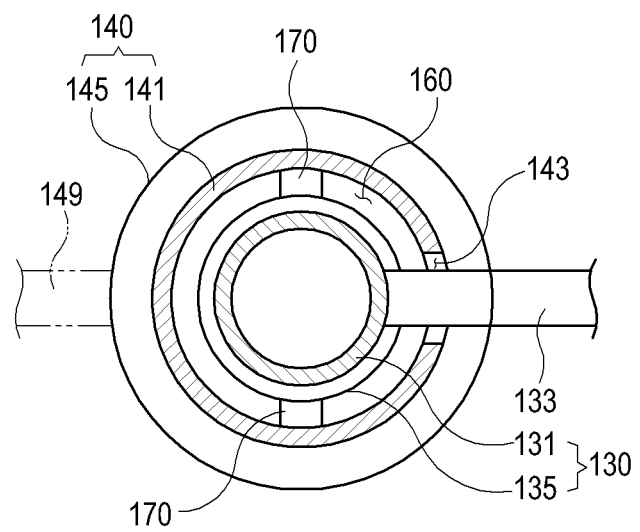

Alternatively, unlike the present example illustrated in FIGS. 5A and 5B, the sub pad 145 may be formed in the fourth layer 127, the signal line 133 may be formed in the third layer 125, and the sub pad 145 and the signal line 133 may be formed in the first layer 121.

Unlike the exemplary embodiment illustrated in FIGS. 2A and 2B, the layer 120 formed with one of the sub pad 145 can be disposed outside the layer 120 formed with one of the signal line 133. Accordingly, the through part 143 through which the signal line 133 passes is formed at the sub column 141.

The through part 143 is an opened area so that the signal line 133 can pass through a middle area of the sub column 141, and is distanced from the signal line 133.

Hereinafter, a manufacturing process of the multi-layer substrate 100 as illustrated in FIGS. 5A and 5B will be described will referring to FIGS. 6A to 6E.

Figure 6A:
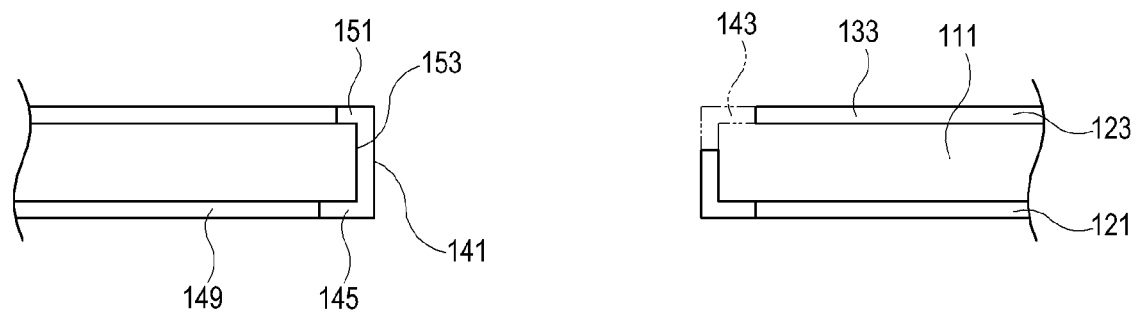
FIGS. 6A to 6E are sectional views illustrating a manufacturing process of the multi-layer substrate in FIG. 5A.

As illustrated in FIG. 6A, the first layer 121, the first substrate main body 111 and the second layer 123 are penetrated, and then the sub column 141 and the sub pad 145 at the lower end part of the sub column 141 are formed. Here, a middle pad 151 extending from an upper end part of the sub column 141 to the second layer 123 may be further included. The middle pad 151 allows the sub column 141 of the upper end part to be easily electrically connected with the sub column 141 of the lower end part. The supporter 170 traverses the inner space of the sub column 141 to be coupled to the sub pad 145. The through part 143 is formed at a right upper part of the sub column 141.

Figure 6B:
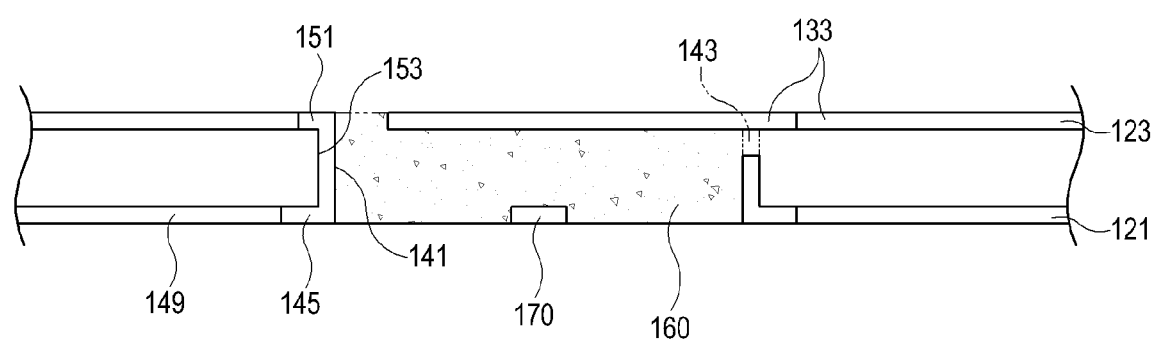

As illustrated in FIG. 6B, the sub dielectric 160 is filled in the sub column 141 from the lower end part. The signal line 133 is formed on the sub dielectric 160 to have the same height as the second layer 123.

Figure 6C:
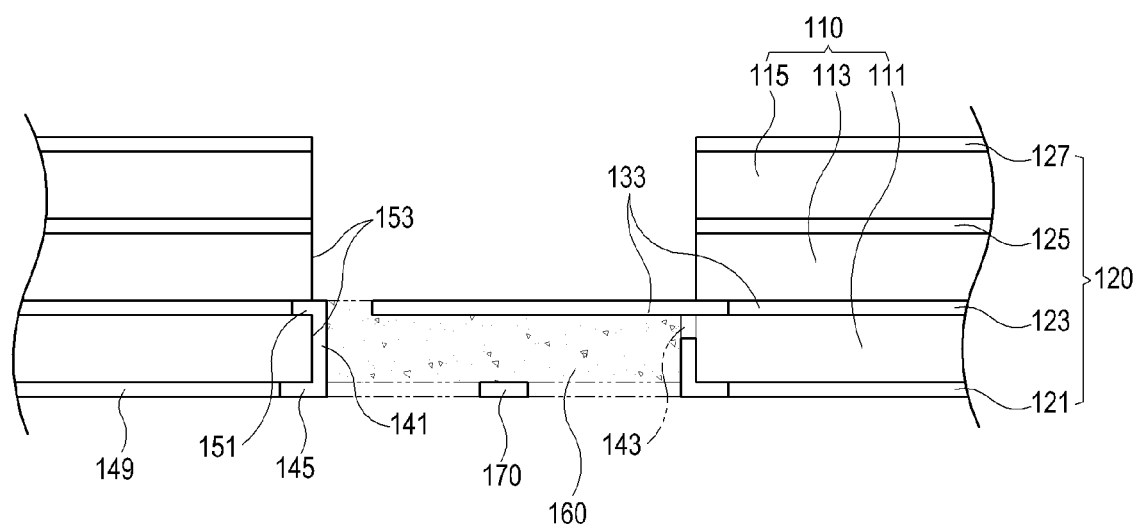

As illustrated in FIG. 6C, the second substrate main body 113, the third layer 125, the third substrate main body 115 and the fourth layer 127 are layered on the second layer 123. The upper sub through hole 153 is formed to pass through the second substrate main body 113, the third layer 125, the third substrate main body 115 and the fourth layer 127.

Figure 6D:
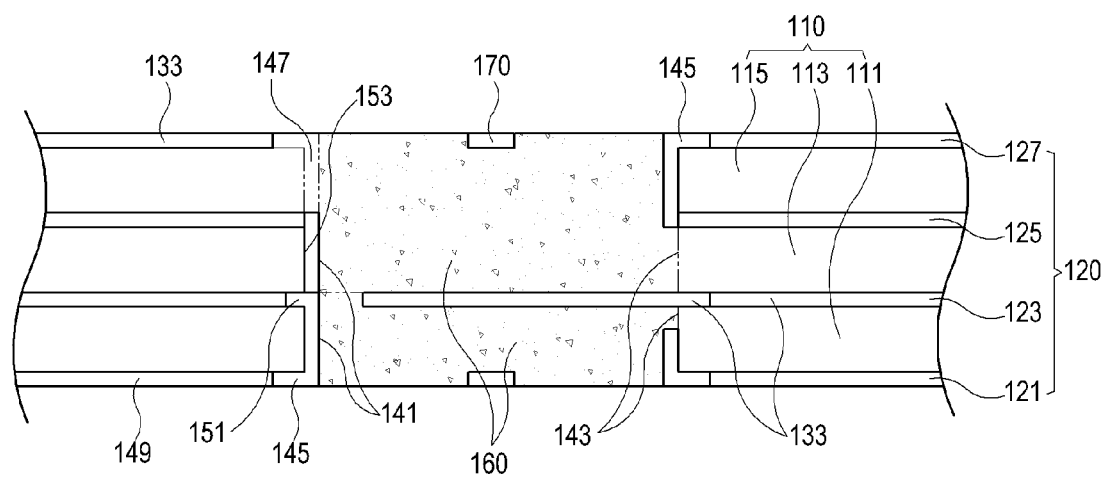

As illustrated in FIG. 6D, an upper part of the sub column 141 is formed, and an upper part of the sub dielectric 160 is filled in the inner space of the upper sub column 141 after the supporter 170 is formed. Here, the through part 143 and the distance part 147 are properly formed as described above.

In FIG. 6D, the middle pad 151 that has been formed at the second layer 123 has a cross sectional area greater than the cross sectional area of the sub column 141 to simplify an electrical connection with the upper part of the sub column 141.

Figure 6E:
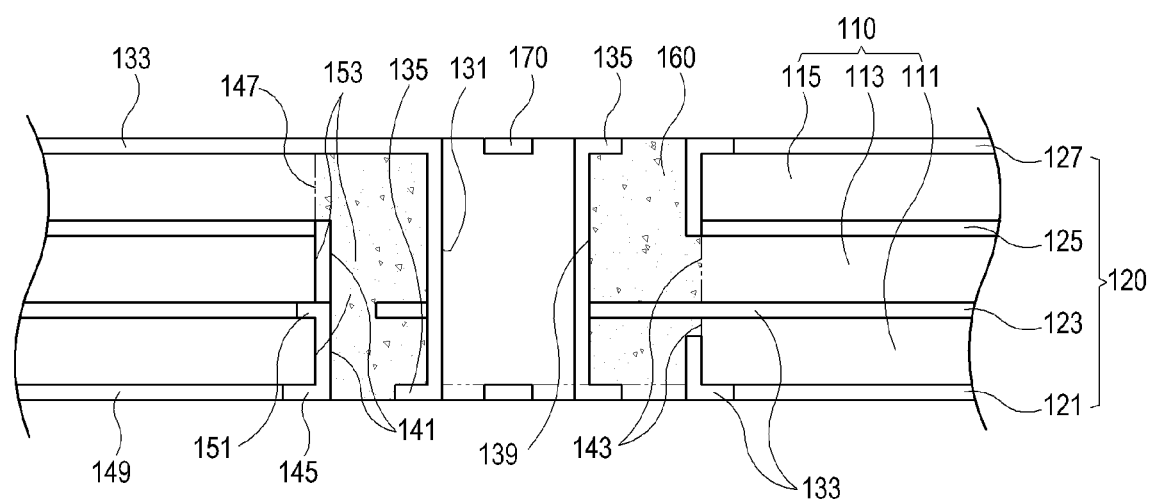

As illustrated in FIG. 6E, the signal through hole 139 is formed, the signal column 131 and the signal pad 135 are formed, and the signal via hole 130 and the signal line 133 are connected by the connection of signal column 131 and signal line 133. The signal pad 135 and the supporter 170 are coupled together.

Accordingly, the present general inventive concept may be applied to various multi-layer substrates in addition to the described multi-layer substrates 100 illustrated in FIGS. 1A to 6D.

Figure 7A:
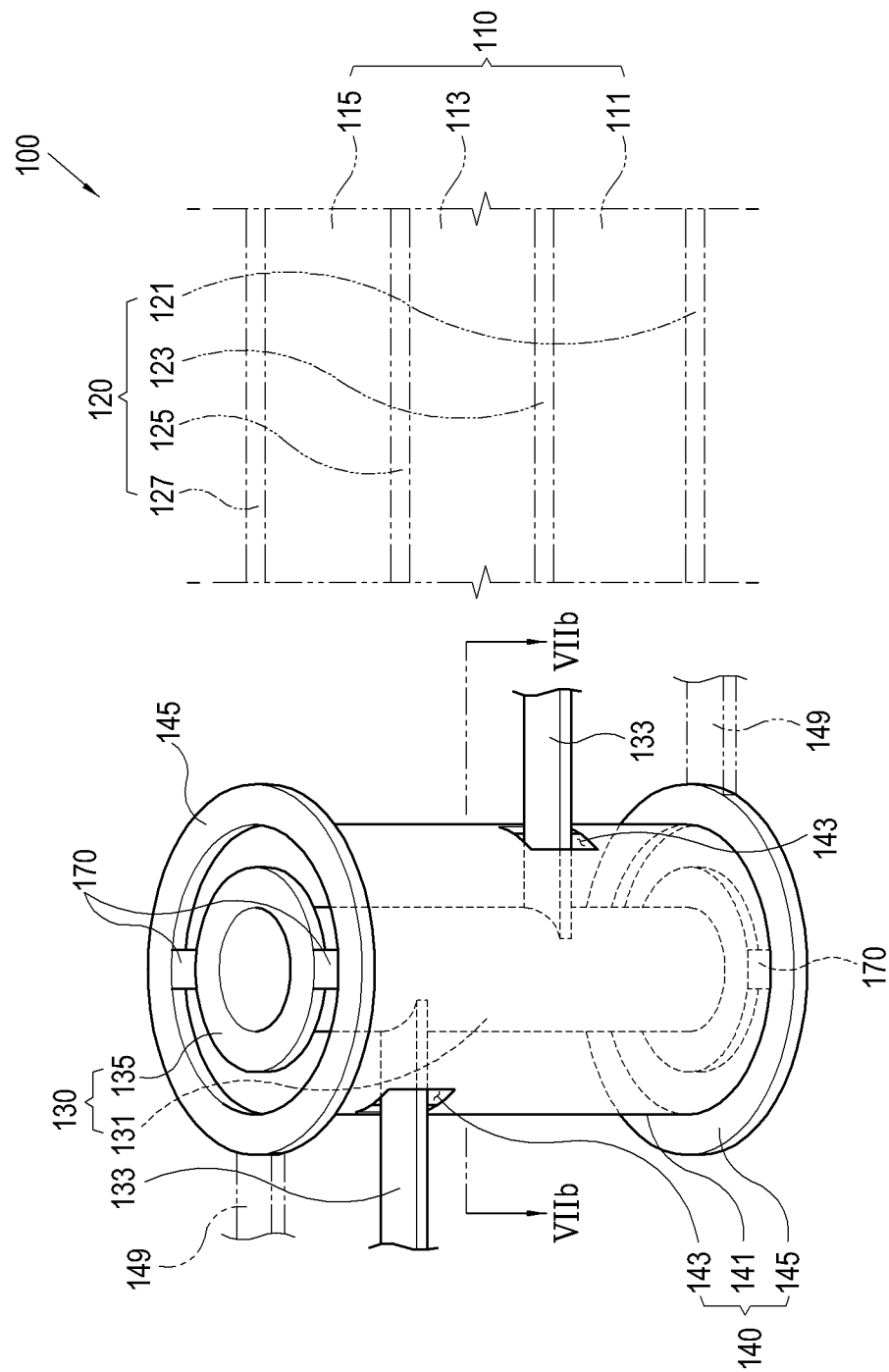
FIGS. 7A and 7B are sectional views illustrating a multi-layer substrate according to a another example of the exemplary embodiment of FIGS. 1A and 1B.
Figure 7B:
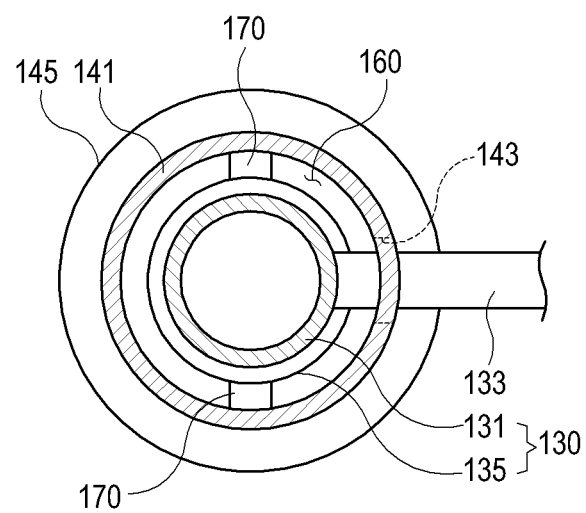

As illustrated in FIGS. 7A and 7B, in the multi-layer substrate 100 according another exemplary embodiment of the present general inventive concept, the layer 120 formed with the sub pad 145 is disposed outside the layer 120 formed with the signal line 133. Accordingly, FIG. 7A illustrates the sub pad 145 being formed in the first layer 121 and the fourth layer 127, and the signal line 133 being formed in the second layer 123 and the third layer 125. In addition, the supporter 170 is formed in the first layer 121 and the fourth layer 127, while the through part 143 is formed into the sub via hole 140.

Accordingly, the embodiments of present general inventive concept may be applied to the multi-layer substrate 100 of various configurations including the configurations of FIG. 2 to FIG. 7.

Figure 8A:
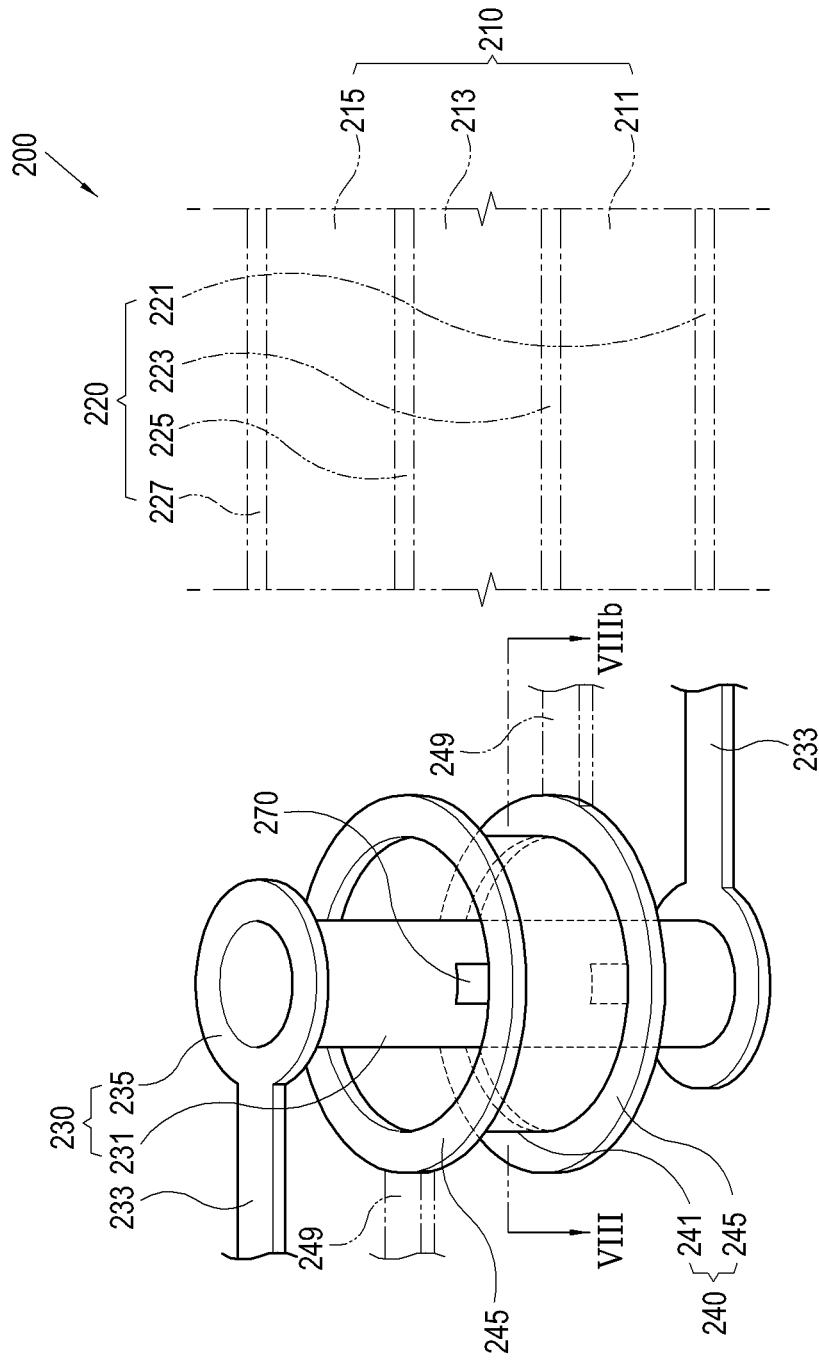
FIGS. 8A and 8B are sectional views illustrating a multi-layer substrate according to another exemplary embodiment of the present general inventive concept.
Figure 8B:
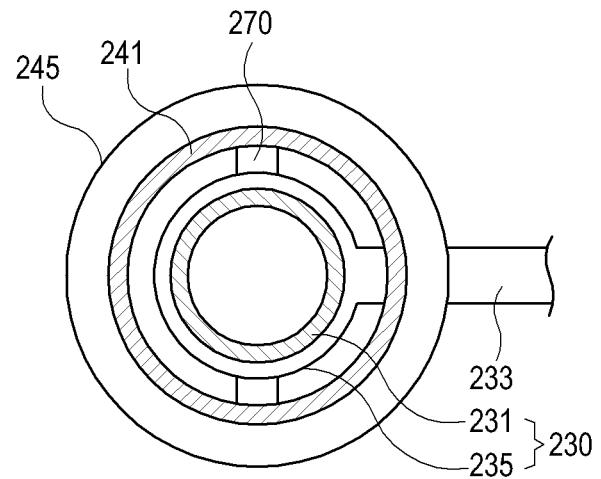

As illustrated in FIGS. 8A and 8B, a multi-layer substrate 200 according to another exemplary embodiment includes a signal via hole 230 which is connected with a signal line 233 and includes a signal column 231 that passes through at least one substrate main body 210, a sub via hole 240 which includes a pair of sub pads 245 extending from end parts of the sub column 241 to be formed on layers 220, and a supporter 270 which connects the signal column 231 and the sub column 241. The layer 220 formed with the sub pad 245 is disposed inside the layer 220 formed with the signal line 233 connected with the signal via hole 230.

Unlike the previous exemplary embodiment, in this exemplary embodiment sub pad 245 is formed in a second layer 223 and a third layer 225, and the signal line 233 is formed in a first layer 221 and a fourth layer 227. The supporter 270 is provided in the second layer 223 and the third layer 225. A grounding line 249 is provided in the second layer 223 and the third layer 225.

Accordingly, the embodiments of present general inventive concept may be applied to the multi-layer substrate 200 of various configurations.

The multi-layer substrate 200 according to this exemplary embodiment may have a manufacturing process similar to the manufacturing process according to the previous exemplary embodiments. In addition, the multi-layer substrate 200 according to this exemplary embodiment may have a signal transmission process similar to the signal transmission process according to the previous exemplary embodiments of the present general inventive concept.

The multi-layer substrate 200 according to this exemplary embodiment may have various configurations including a configuration according to the previous exemplary embodiments of the present general inventive concept.

Figure 9A:
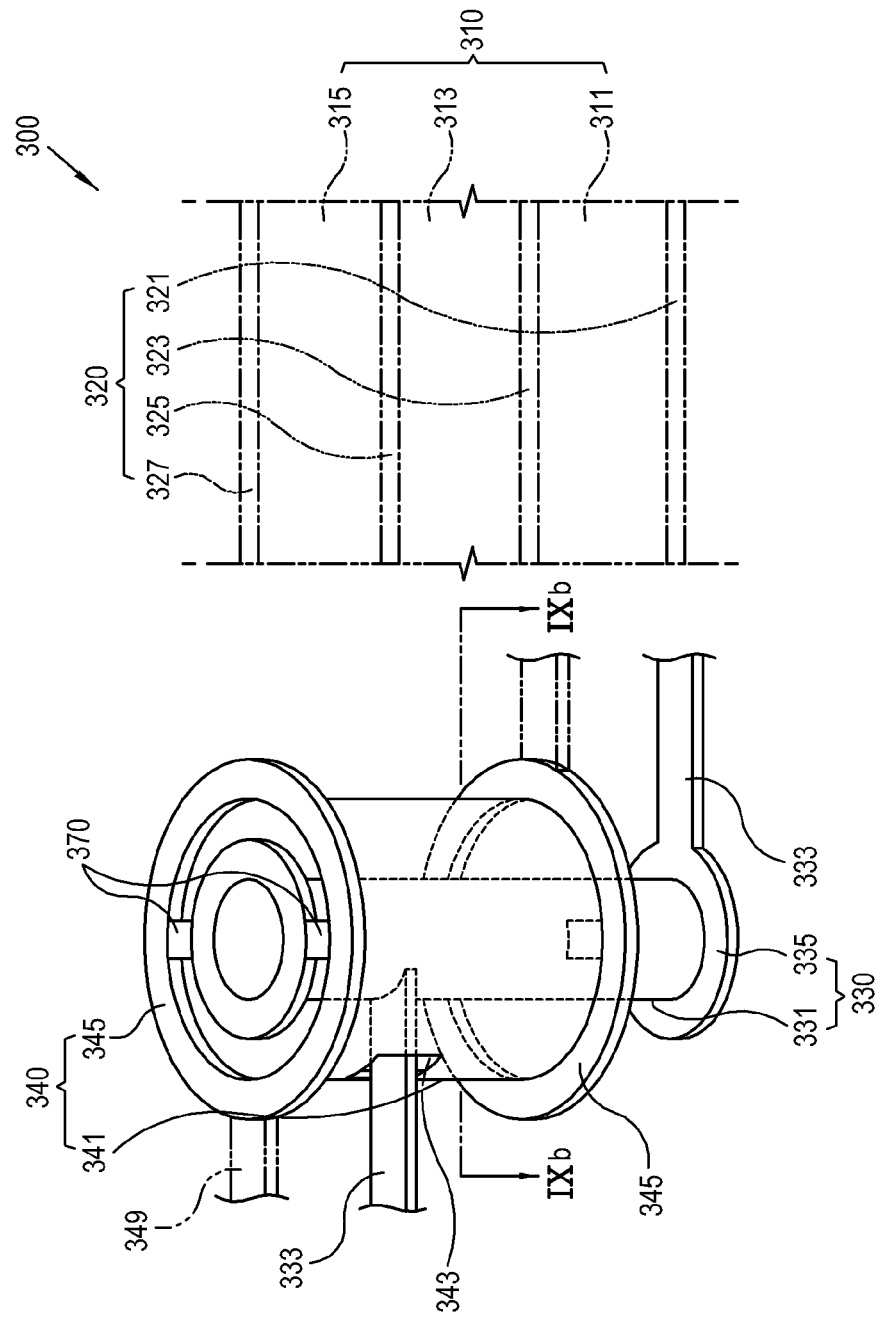
FIGS. 9A and 9B are sectional views illustrating a multi-layer substrate according to another exemplary embodiment of the present general inventive concept.
Figure 9B:
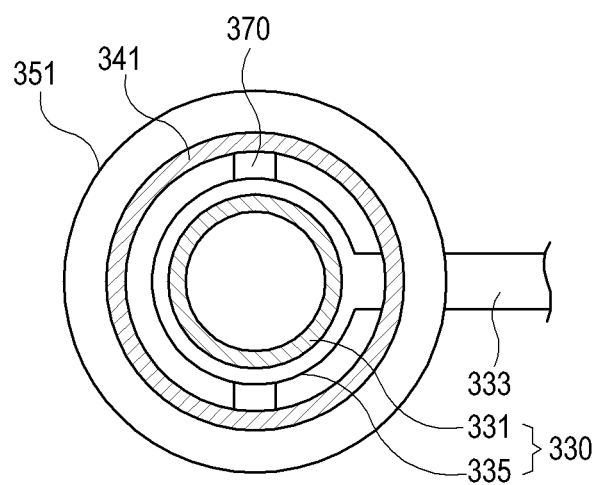

As illustrated in FIGS. 9A and 9B, a multi-layer substrate 300 according to another exemplary embodiment of the present general inventive concept includes a signal via hole 330 which is connected with a signal line 333 and includes a signal pad 335 and a signal column 331 that passes through at least one substrate main body 310, a sub via hole 340 which includes a sub column 341 that surrounds the signal column 331, and a pair of sub pads 345 extending from end parts of the sub column 341 to be formed on layers 320. The layer 320 is formed with one first sub pad 345 disposed outside the layer 320 formed with a first signal line 333 connected with the signal via hole 330, and the layer 320 is formed with another sub pad 345 disposed inside the layer 320 formed with a second signal line 333 connected with the signal via hole 330. Thus, sub pads 345 are formed in a second layer 33 and a fourth layer 327, and the signal lines 333 are formed in a first layer 321 and a third layer 325, respectively. In addition, a supporter 370 is formed in the second layer 323 and the fourth layer 327. A through part 343 is formed to the sub column 341, and a grounding line 349 is formed in the second layer 323 and the fourth layer 327.

Accordingly, the embodiments of present general inventive concept may be applied to the various multi-layer substrates in addition to the multi-layer substrate 300 illustrated in FIG. 9A.

The multi-layer substrate 300 according to this exemplary embodiment may have a manufacturing process similar to the manufacturing process according to the previous exemplary embodiments.

Also, the multi-layer substrate 300 according to this exemplary embodiment may have a signal transmission process similar to the signal transmission process according to the previous exemplary embodiments.

In the multi-layer substrate 300 according to this exemplary embodiment, a configuration not described may include a configuration according to the previous exemplary embodiments.

As described above, the various embodiments of present general inventive concept provides a multi-layer substrate and an electronic device having the same which can minimize discontinuity of a signal transmission path and a return current path.

Also, the various embodiments of present general inventive concept provides a multi-layer substrate and an electronic device having the same which can prevent an EMI radiated in a signal via hole.

Also, the various embodiments of present general inventive concept provides a multi-layer substrate and an electronic device having the same which can improve a signal transmitting ability of a signal line.

Also, the various embodiments of present general inventive concept provides a multi-layer substrate and an electronic device having the same which can stably support a signal via hole.

Although a few exemplary embodiments of the present general inventive concept have been illustrated and described, it will be appreciated by those skilled in the art that changes may be made in these embodiments without departing from the principles and spirit of the general inventive concept, the scope of which is defined in the appended claims and their equivalents.

What is claimed is:

1. A multi-layer substrate comprising:
a plurality of substrate main bodies;
a plurality of layers alternately layered with the main bodies, the plurality of substrate main bodies and layers having a sub through-hole therein;
a hollow sub column located around an inner circumference of the sub through-hole, the hollow sub column connected to at least one grounding line located in a same layer as at least one of the plurality of layers,
the hollow sub column including a distance part or a through part such that the hollow sub-column does not contact at least one signal line located in a same layer as at least one of the plurality of layers, and
the at least one grounding line located in a same layer as the at least one signal line passing the distance part or the through part, the at least one grounding line and the at least one signal line being arranged to get away from each other;
a pair of sub pads extending from ends of the sub column to contact respective layers;
a hollow signal column located within the hollow sub column to define a signal via hole, the signal column connected to the at least one signal line; and
a supporter which connects the signal column and the sub column to hold the signal column within the sub column at a predetermined distance from the sub column, the supporter passing through the sub dielectric.

2. The multi-layer substrate according to claim 1, wherein:
the substrate main bodies comprise a dielectric,
a sub dielectric is located between the signal column and the sub column, and
the sub dielectric comprises the same material as the substrate dielectric.

3. The multi-layer substrate according to claim 1, wherein:
the substrate main bodies comprise a dielectric,
a sub dielectric is located between the signal column and the sub column, and
the sub dielectric comprises the same material as the substrate dielectric.

4. The multi-layer substrate according to claim 1, wherein:
the substrate main bodies comprise a dielectric,
a sub dielectric is located between the signal column and the sub column, and
the sub dielectric comprises material different from the substrate dielectric.

5. The multi-layer substrate according to claims 1, wherein:
the substrate main bodies have the same property as a substrate dielectric,
a sub dielectric is located between the signal column and the sub column, and
the sub dielectric comprises material different from the substrate dielectric.

6. The multi-layer substrate according to claim 1, further comprising:
a supporter which connects the signal column and the sub column.

7. A multi-layer substrate comprising:
a plurality of substrate main bodies;
a plurality of layers alternately layered with the main bodies, the plurality of substrate main bodies and layers having a sub through-hole therein;
a hollow sub column located around an inner circumference of the sub through-hole;
a pair of sub pads extending from ends of the sub column to contact respective layers;
a hollow signal column located within the hollow sub column to define a signal via hole, the signal column connected to at least one signal line located in a same layer as at least one of the plurality of layers;
a sub dielectric located between the signal column and the sub column; and
a supporter which connects the signal column and the sub column to hold the signal column within the sub column at a predetermined distance from the sub column, the supporter passing through the sub dielectric,
wherein the layers contacting the sub pads are disposed inside the at least one layer which is located in the same layer as the at least one signal line.

8. The multi-layer substrate according to claim 7, wherein:
the multi-layer substrate forms a substrate dielectric by means of property of the substrate main bodies, and
the sub dielectric comprises material different from the substrate dielectric.

9. A multi-layer substrate comprising:
a plurality of substrate main bodies;
a plurality of layers alternately layered with the main bodies, the plurality of substrate main bodies and layers having a sub through-hole therein;
a hollow sub column located around an inner circumference of the sub through-hole;
a first and second sub pads extending from ends of the sub column to contact respective layers;
a hollow signal column located within the hollow sub column to define a signal via hole, the signal column connected to a first signal line and a second signal line,
a sub dielectric located between the signal column and the sub column;
a supporter which connects the signal column and the sub column to hold the signal column within the sub column at a predetermined distance from the sub column, the supporter passing through the sub dielectric, wherein a layer contacting the first sub pad is disposed outside a layer which is a same layer as the first signal line connected with the signal column, and wherein a layer contacting the second sub pad is disposed inside a layer which is a same layer as the second signal line connected with the signal column.

10. The multi-layer substrate according to claim 9, wherein the sub column is formed with a through part through which one of the first or the second signal lines passes.

11. The multi-layer substrate according to claim 9, wherein:
the substrate main bodies comprise a dielectric, and
the sub dielectric comprises the same material as the substrate dielectric.

12. The multi-layer substrate according to claim 9, wherein:
the substrate main bodies comprise a dielectric, and
the sub dielectric comprises material different from the substrate dielectric.

13. The multi-layer substrate according to claim 9, wherein the sub pads are grounded.

14. An electronic device, comprising:
the multi-layer substrate according to claim 1.

15. An electronic device, comprising:
the multi-layer substrate according to claim 7.

16. An electronic device, comprising:
the multi-layer substrate according to claim 9.

17. A multi-layer substrate comprising:
a plurality of substrate main bodies;
a plurality of layers alternately layered with the main bodies, the plurality of substrate main bodies and layers having a sub through-hole therein;
a hollow sub column located around an inner circumference of the sub through-hole;
a sub pad connected to the sub column to contact one of the layers;
a hollow signal column located within the hollow sub column to define a signal via hole, the signal column connected to a signal line located in a same layer as one of the plurality of layers;
a signal pad connected to the signal column;
a sub dielectric located between the signal column and the sub column;
a supporter which connects the signal column and the sub column to hold the signal column within the sub column at a predetermined distance from the sub column, the supporter passing through the sub dielectric,
wherein the sub pad is disposed along a same plane as the one of the plurality of layers which is located in a same layer as the signal line.

18. The multi-layer substrate according to claim 17, wherein the signal pad is disposed along a same plane as the one of the plurality of layers which is located in the same layer as the signal line.

19. The multi-layer substrate according to claim 17, wherein:
the multi-layer substrate further comprises a plurality of sub pads connected to the sub column,
the signal pad comprises a plurality of signal pads, and
the signal line comprises a plurality of signal lines.

20. The multi-layer substrate according to claim 19, wherein the plurality of sub pads are disposed between the plurality of signal pads.

21. The multi-layer substrate according to claim 19, wherein the plurality of sub pads and the plurality of signal pads are disposed with the plurality of layers which are located in same layers as the plurality of signal lines.

22. The multi-layer substrate according to claim 19, wherein one of the plurality of sub pads is disposed between the plurality of signal pads and another one of the plurality of sub pads is disposed with one of the plurality of layers which is located in a same layer as the signal line and one of the plurality of signal pads.

23. The multi-layer substrate according to claim 17, further comprising a supporter which couples the signal pad and the sub pad.

24. The multi-layer substrate according to claim 17, wherein the sub column includes a through part through which at least one signal line passes.

25. The multi-layer substrate according to claim 17, wherein a signal transmission current path traveling within the signal line including a plurality of signal lines and the signal column and sub column is substantially the same as a return current path.

26. The multi-layer substrate of claim 1, wherein the signal column completely surrounds a circumference of the signal via hole.

27. The multi-layer substrate of claim 1, wherein the signal via hole does not have any filling inside thereof.

28. The multi-layer substrate of claim 1, wherein the pair of sub pads have greater outer circumferences than a circumference of the sub column and substantially surrounds the sub column at the respective end parts of the sub column.

29. The multi-layer substrate of claim 1, wherein the hollow signal column includes a pair of signal pads extending from respective ends of the signal column to have greater outer circumferences than a circumference of the signal column and substantially surrounds the signal column at the respective ends of the signal column.

30. The multi-layer substrate of claim 1, wherein the signal line is connected to an inner layer of the plurality of layers, the inner layer being disposed between outer layers of the plurality of layers.

31. The multi-layer substrate of claim 1, wherein a signal transmission current path is at the signal line and a return current path is at one of the plurality of layers that is a closest layer to the at least one signal line.

32. The multi-layer substrate of claim 1, wherein the substrate main bodies are capable of functioning as dielectric substrates such that a polarization is generated in the substrate main bodies when a signal is transmitted to the at least one signal line.

* * * * *